United States Patent

Stapleton

[11] Patent Number: 5,845,106
[45] Date of Patent: Dec. 1, 1998

[54] METHOD FOR SIMULATING CACHE OPERATION

[75] Inventor: Warren G. Stapleton, San Jose, Calif.

[73] Assignee: Advanced Micro Devices, Inc., Austin, Tex.

[21] Appl. No.: 592,829

[22] Filed: Jan. 26, 1996

[51] Int. Cl.⁶ ................................................ G06F 12/03
[52] U.S. Cl. ............................................. 395/500; 364/489
[58] Field of Search ................................. 395/500, 403, 395/400, 425, 421.06, 435, 460, 455, 700; 364/403, 243.4, 243.41, 488, 489, 280.1, 280.4, 253, 256.4, 256.3

[56] References Cited

U.S. PATENT DOCUMENTS

| | | | |
|---|---|---|---|
| 5,392,410 | 2/1995 | Liu | 395/400 |
| 5,442,571 | 8/1995 | Sites | 364/403 |
| 5,493,508 | 2/1996 | Dangelo et al. | 364/489 |
| 5,530,833 | 6/1996 | Iyengar et al. | 395/455 |
| 5,530,958 | 6/1996 | Agarwal et al. | 395/403 |
| 5,539,907 | 7/1996 | Srivastava et al. | 395/700 |

*Primary Examiner*—Kevin J. Teska
*Assistant Examiner*—Matthew Loppnow
*Attorney, Agent, or Firm*—Skjerven, Morrill, MacPherson, Franklin & Friel; Edward C. Kwok

[57] ABSTRACT

Multiple functional units of a computer system that typically access a secondary cache and the main memory system independently and simultaneously are simulated using RTL models which create such accesses using a random process. In one embodiment, an RTL model of each functional unit generates accesses to the cache memory according to a programmable frequency. The RTL models of these functional units also generate addresses which fall within programmable address limits and tag limits. In one embodiment, the functional units include data and instruction table lookaside buffers which traverse a two-level address translation scheme.

11 Claims, 4 Drawing Sheets

METHOD FOR SIMULATING CACHE OPERATION

CROSS REFERENCE TO APPENDIX INCLUDING A COMPUTER PROGRAM LISTING

Appendix A, which is a part of the present disclosure, is an appendix consisting of 20 sheets of listing of a computer program and related data in one embodiment of this invention. This listing of computer programs contains material which is subject to copyright protection. The copyright owner has no objection to the facsimile reproduction by anyone of the patent document or the present disclosure, as it appears in the Patent and Trademark Office patent files or records, but otherwise reserves all copyright rights whatsoever.

BACKGROUND OF THE INVENTION

1. Field of the Invention

The present invention relates to a method for simulating the operations of a computer system. In particular, the present invention relates to simulating the operations of a cache memory and an interface to a system bus in a computer system.

2. Discussion of the Related Art

Cache memories and bus interfaces in a computer system are typically difficult to simulate because, not only is there limited control available to the central processing unit, cache memories and bus interfaces are accessed by numerous functional units each accessing the cache memories or the bus interfaces independently and simultaneously with each other. Activities in a computer system performed by different functional units include instruction fetches, data read or write operations, memory address translation operations in the instruction and data translation lookaside buffers (TLBs), and accesses to the main memory by input/output peripheral devices. As mentioned above, these activities in the computer system are typically related to each other in a fairly complex manner, both in terms of their individual patterns of access to these resources and the timing relationships of their accesses relative to each other. Consequently, the number of input vectors that are required to exhaustively simulate such a system is unmanageably huge. Thus, in a typical computer system, to design a deterministic simulation program to realistically simulate all operations in the computer system is almost impossible.

SUMMARY OF THE INVENTION

The present invention provides a method for simulating, at the register transfer (RTL) level, the operations of a cache memory or a bus interface in a computer system. The simulation of the present invention enables a simulation in which a relatively large number of functional units independently and simultaneously access the cache memory or the bus interface. The method of the present invention includes the steps of: (a) creating an RTL model for the cache memory; (b) for each of the functional units, creating an RTL model capable of randomly generating (i) an access event to the cache memory at a programmable frequency, and (ii) an address for use with the access event; and (c) at each simulation time period, invoking the RTL model of each functional unit to generate, with a programmable probability, an access event to the cache memory or the bus interface. If that access event is generated, the method simulates access to the cache memory or the bus interface by submitting the address generated with the access event to the RTL model of the cache memory or the bus interface.

In one embodiment of the present invention, the method further includes an RTL model for a main memory system. In addition, a second memory image accessible by the functional units which access the cache memory or the bus interface is provided. This second memory image (called the "shadow memory") is initialized to be identical, initially, to the first memory image (i.e. the main memory system). The second memory image is maintained to mirror the expected content of the first memory image. In that embodiment, at the end of each simulation period, data retrieved from the RTL model of the cache memory is compared to data in the second memory image.

In one embodiment, the method of the present invention generates an access event whenever a randomly generated number exceeds a programmable value. The address generated for that access can be generated to fall within a programmable address range. In that embodiment, the randomly generated address can be an address of a page table entry. The randomly generated address can be required to fall within both a programmable index range and a programmable tag range.

In one embodiment, RTL models which generate random access events are used to model a first level instruction cache, a first level data cache, an instruction table lookaside buffer (TLB), and a data TLB. The data cache can also be modelled by two RTL models, a first RTL model simulating a read access and a second RTL model simulating a write access.

By using a random process to generate accesses to a cache memory, the present invention allows a realistic simulation of the cache memory without using an exhaustive set of input vectors. Also, control structures necessary for simulating such functional units which independently and simultaneously access the cache memory are greatly simplified. The use of a shadow memory image allows verification of the data returned from the cache system and the memory system.

The present invention is better understood upon consideration of the detailed description below and the accompanying drawings.

BRIEF DESCRIPTION OF THE DRAWINGS

FIG. 5b shows a state machine 510 in DCR requester 206a.

DETAILED DESCRIPTION OF THE PREFERRED EMBODIMENTS

The present invention provides a method for simulating a cache memory system or a bus interface based on a set of randomly generated input vectors, rather than an exhaustive set of input vectors.

Figure 1:
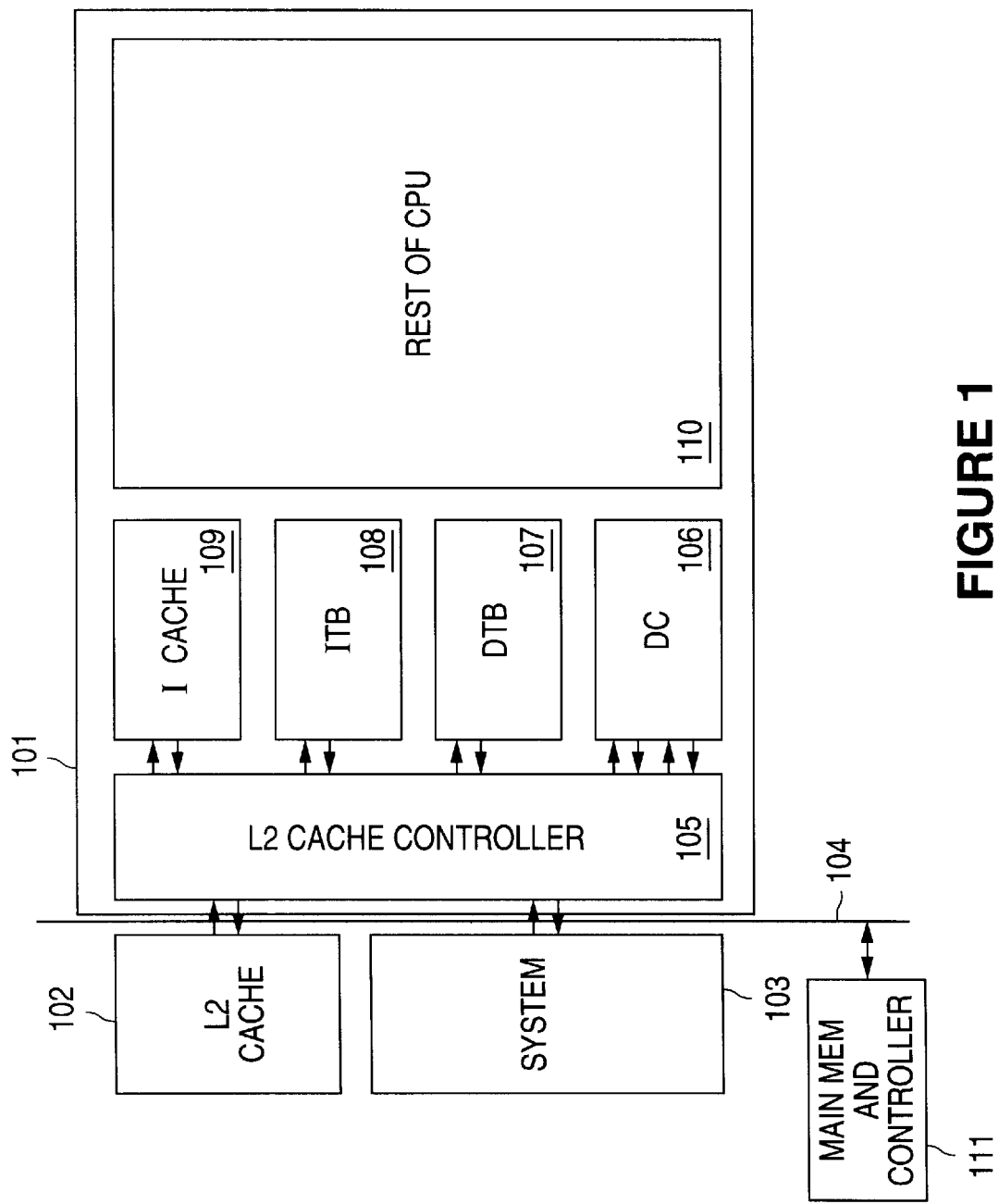
FIG. 1 shows a computer system 100 which includes a microprocessor 101, a secondary cache 102, an input/output system 103 coupled to a system bus 104, and a main memory system 111.

The present invention is applicable to a computer system such as that illustrated by FIG. 1. FIG. 1 shows a computer system 100 which includes a microprocessor 101, a secondary cache 102, an input/output (I/O) system 103, and a main memory system 111. In FIG. 1, a system bus 104 couples microprocessor 101, secondary cache 102 and I/O system 103. Main memory system 111 includes a memory controller for the main memory.

As shown in FIG. 1, microprocessor 101 includes a number of functional units which access secondary cache 102 through a cache controller 105. Such functional units include an instruction cache 109, an instruction table lookaside buffer (TLB) 108, a data TLB 107 and a data cache. TLBs and instruction and data caches are functional units of a computer system well-known to those of ordinary skill in the art. The remainder of microprocessor 101, indicated generally by reference numeral 110, is not shown in detail in FIG. 1, as the operations of microprocessor 101 outside of the functional units 105–109 shown are well-known and not germane to the present invention.

In microprocessor 101, accesses to secondary cache 102 are initiated by memory access requests sent to secondary cache controller 105 by instruction cache 109, instruction TLB 108, data TLB 107 and data cache 106. In addition, main memory accesses by I/O system 103, e.g. direct memory access (DMA), may also require invalidation of entries in secondary cache 102. To detect such activities by I/O system 103, secondary cache controller 105 monitors ("snoops") through a bus interface the addresses of write accesses on system bus 104 and invalidates the corresponding entry in secondary cache 102, when a write access to a cached main memory location is detected. In addition, microprocessor 101 may include also a write buffer for queuing write requests to main memory and secondary cache 102.

According to the present invention, to simulate the cache system of computer system 100 and the associated bus interface activities, randomly generated cache accesses from instruction cache 109, instruction TLB 108, data TLB 107, data cache 106, and the bus interface to system bus 104 are provided. These cache accesses are received at secondary cache controller 105. The present invention thus isolates the remainder 110 of microprocessor 101 from the simulation of the cache system and the associated bus activities by assuming that direct access requests to secondary cache controller 105 by the remainder 110 of microprocessor 101 are nonexistent.

To achieve simulation of the cache system and the associated bus interface activities, register transfer level (RTL) models of I/O system 103, cache controller 102, cache system 204, instruction cache 109, instruction TLB 108, data TLB 107 and data cache 106 are created. These RTL models and their interrelationships are shown in FIG. 2.

Figure 2:
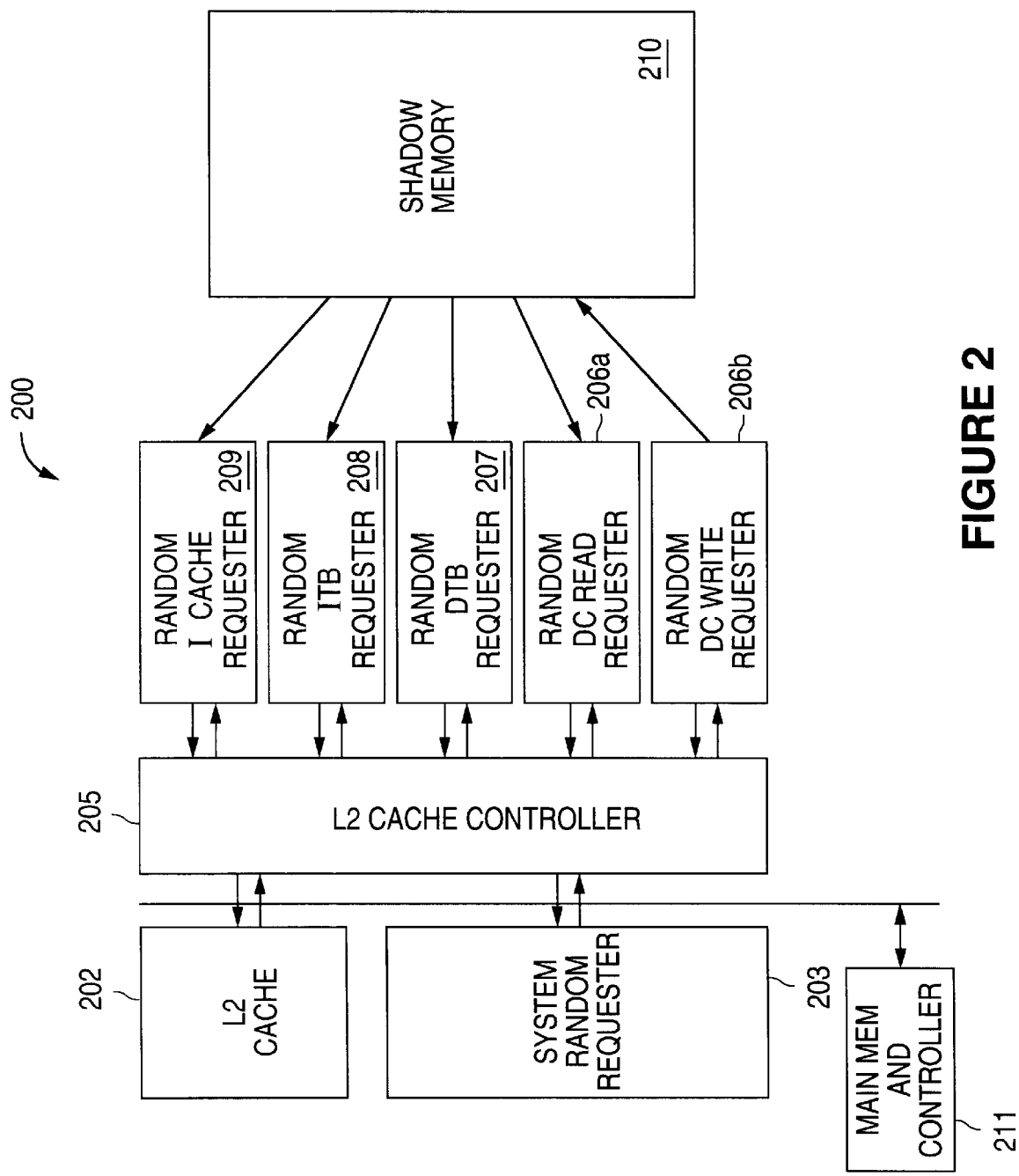
FIG. 2 shows a conceptual view of an RTL model of computer system 100, created for the purpose of simulating computer system 100's cache system and associated bus interface activities.

FIG. 2 shows a conceptual view of an RTL model of computer system 100, created for the purpose of simulating computer system 100's cache system and associated bus interface activities. As shown in FIG. 2, secondary cache 102 is represented by secondary cache RTL model 202, I/O system 103 is represented by a system I/O requester 203, instruction cache 109 is represented by I-cache requester 209, instruction TLB 108 is represented by ITB requester 208, data TLB 107 is represented by DTB requester 207, data cache 106 is represented by DCR ("data cache read") requester 206a and DCW ("data cache write") requester 206b, secondary cache controller 105 is represented by secondary cache controller RTL model 205, and main memory system 111 is represented by main memory system RTL model 211. In this embodiment, the read and write activities of data cache 106 are represented by two separate modules. Conceptually separating the handling of data cache read and data write accesses yields better insights into the performance of the data cache.

In order to verify correct operation of the cache system, a shadow memory 210 is provided. Shadow memory 210 is intended to be a mirror image of the main memory. Thus, the memory images of shadow memory 210 and main memory 111 would be identical, if computer system 100 is error free. The contents of shadow memory 210 can therefore be used, in comparison with the data returned from cache memory RTL model 202 and main memory RTL model 211, to verify that these functional units are correctly simulated.

In this embodiment, although other methods of providing RTL models are also possible, secondary cache RTL model 202, system I/O requester 203, I-cache 208, ITB requester 209, DTB requester 207, DCR requester 206a, DCW requester 206b, secondary cache controller RTL model, and main memory system RTL model 211 are created using an object-oriented programming language, according to a method disclosed in a copending patent application ("Copending Application"), entitled "Design for a Simulation Module Using an Object-Oriented Programming Language" by Warren G. Stapleton, filed on the same date as the present application, Ser. No. 08/592,041, assigned to NexGen Microsystems, Inc., which is also the assignee of the present application. The teachings of the Copending Application is hereby incorporated by reference in its entirety. Also, in this embodiment, the program segments implementing the RTL models I/O requester 203, ITB requester 209, DTB requester 207, DCR requester 206a, DCW requester 206b are included in the RTL model of secondary cache controller 209.

In the present embodiment, as discussed above, each RTL model is written using the object-oriented programming language. In this instance, the object-oriented programming language is C++. Each RTL model of the present embodiment is based on objects derived from a base class module, which is defined as follows:

```
Class module {
public:
        module(): __next (NULL) {}
        virtual initial() {}
        virtual LdNewState() {}
        virtual GenNewState() {}
        module *getNext() const {return __next;}
        void setNext(module *next) {__next=next;}
private:
        __next;
}
```

As shown above, the class module includes member functions initial ( ), LdNewState ( ), GenNewState ( ), getNext ( ), and setNext ( ), and a private pointer next. The private pointer next allows module objects to be chained in a linked list. The member functions setNext ( ) and getNext ( ) are provided for inserting a new module and traversing the linked list, respectively. The member function initial ( ) of a module provides an initial state of the logic circuit represented by the module. As mentioned above, the member function LdNewState ( ) loads a new state into the state elements of the module. The member function GenNewState ( ) generates the next state for the module. The generated next state is loaded into the state elements of the module at the next execution of member function LdNewState ( ).

Figure 3:
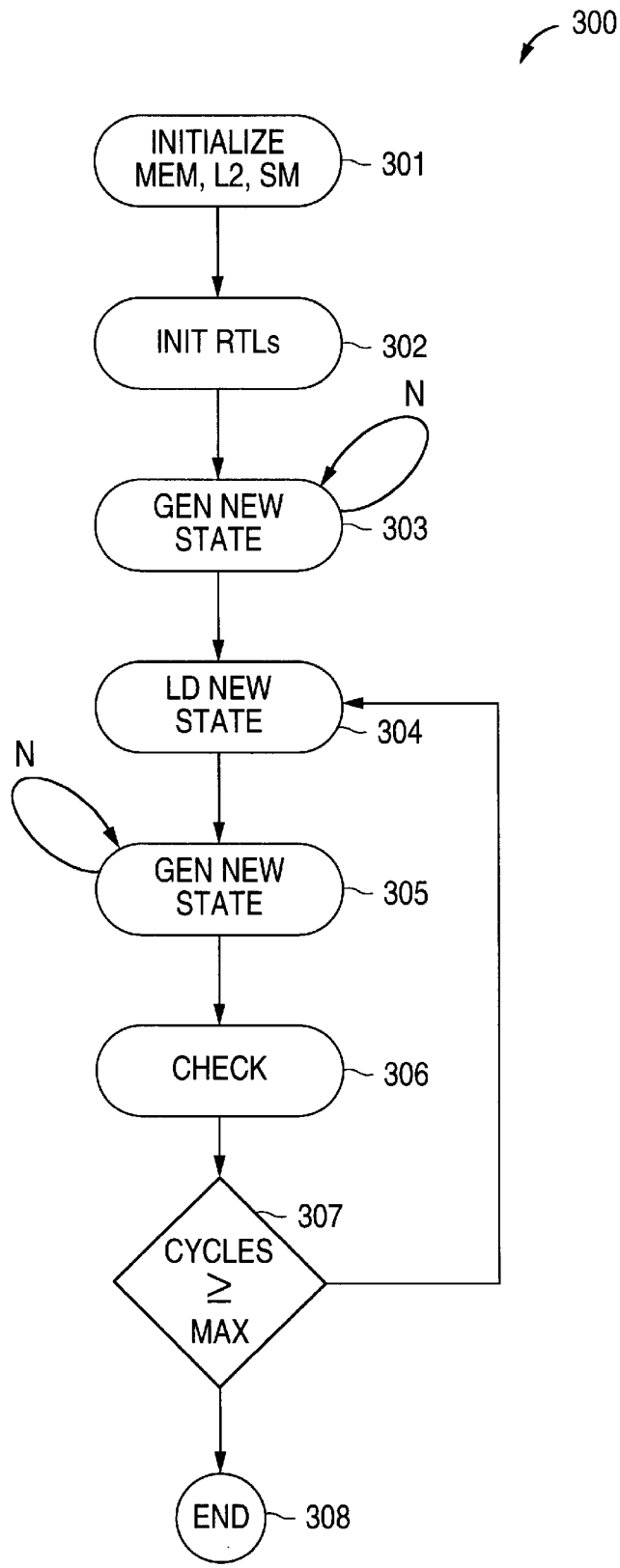
FIG. 3 is a flow diagram showing the simulation flow 300 of computer system 100's cache system and bus interface.

FIG. 3 is a flow diagram showing the simulation flow 300 of computer system 100's cache system and bus interface. As shown in FIG. 3, initially, i.e. at step 301, each word in the memory images of main memory RTL model 211, secondary cache RTL model 202 and shadow memory 210 are initialized to a predetermined pattern. Then, at step 302, main memory RTL model 211 (including the memory controller), secondary cache RTL model 202 and secondary cache controller RTL model 205 are initialized by invoking each module's member function initial ( ). At step 303, the member function GenNewState ( ) of each of main memory RTL model 211, secondary cache RTL model 202 and second cache controller RTL model 205 is invoked to provide a next state to each module. To avoid any potential inconsistency due to the order of execution of these RTL models, step 303 is repeated a predetermined number of times to ensure that the next states of main memory RTL model 211, secondary cache RTL model 202 and second cache controller RTL model 205 are consistent with each other. Simulation then begins by reiterating steps 304–307 over the entire simulation period. At step 304, the LdNewState ( ) member function loads a new state into each module. Thereafter, at step 305, a consistent next state is created by calling each module's member function GenNewState ( ). As in step 303, step 305 may be required to be executed multiple times to ensure convergence to consistent next states among main memory RTL model 211, secondary cache RTL model 202 and second cache controller RTL model 205.

At step 306, a check ( ) function is invoked to verify that data retrieved from an instruction fetch, or a data fetch from secondary cache 202, or requests for address translation from ITB RTL model 208 and DTB RTL model 207 are properly handled. With respect to instruction and data cache read operations, the function check ( ) compares the data returned to secondary cache controller RTL model 205 from the cache memory RTL model 202 or main memory RTL model 211, to the corresponding data in shadow memory 210. With respect to requests for address translation from ITB RTL model 208 and DTB RTL model 207, check ( ) updates the page tables in secondary cache controller RTL model 205, in the manner described in further detail below. Simulation ends when the number of simulated periods executed reaches a predetermined target.

Figure 4:
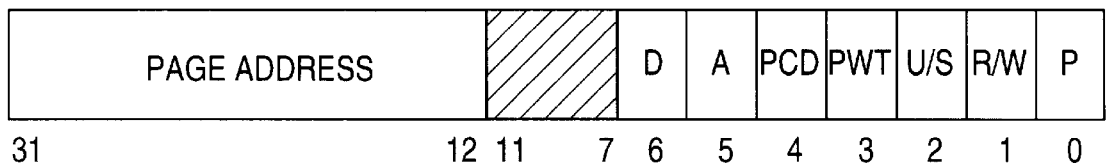
FIG. 4 shows the bit fields of a first level page table entry (PDE) or a second level (PTE) page table entry in one embodiment of the present invention.

In this embodiment, a two-level address translation scheme is used. The two-level page tables are initialized at step 302. Page table initialization is carried out when secondary cache controller RTL model 205 is initialized. In the following discussion, the first and second level page tables, each pointed to by a page table base address, have entries which are referred to as PDEs and PTEs below. Each PDE or PTE is a 32-bit value divided into the fields illustrated in FIG. 4. As shown in FIG. 4, the first 20 bits, i.e. PDE[31:12] of PTE[31:12] are the most significant 20 bits of the base addresses at which the first level page table and the second level page table are found. To obtain a meaningful simulation, the first and second level page tables must be consistently initialized, i.e. the first level page table entries (PDEs) must initially point to valid second level page tables entries (PTE). Such consistency is accomplished by setting the most significant 20 bits of each PDE to point to the most significant 20 bits of the second level page table base address ("PTEBaseAddress"). The first level page tables (PDEs) are given a base address "PDEBaseAddress". Both the PDEBaseAddress and the PTEBaseAddress are randomly generated. The least significant 7 bits of a PDE or a PTE are status bits of the PDE or the PTE: (a) a dirty bit "D" (bit 6), which indicates whether the cached data at the referenced address has been modified, (b) an access bit "A" (bit 5), which indicates whether the cached data has been read or written, (c) a "caching disabled" bit "PCD"(bit 4), which indicates whether or not data at the page address can be cached, (d) a cache write through bit "PWT" (bit 3), which indicates whether or not the data at the page address is required to be "written through" (i.e. the cache data must be immediately written back to memory when modified), (e) a user/system bit "U/S" (bit 2), which indicates whether the page is owned by a system process or by a user process, (f) a read/write "R/W" (bit 1), which indicates whether or not the data at the page address is write protected, and (g) a "present" bit "P" (bit 0) which indicates the page table entry is a valid entry. Other than the 20-bit page address field of PDE's, i.e. PDE[31:20], all fields in the PDEs and the PTEs are initialized randomly. In each bit field, to achieve a predetermined expected ratio of set to unset bits, a randomly generated number is compared to a predetermined threshold. For example, if it is desired that 70% of the PTE's have their "U/S" bit set, an 8-bit random number can be used (i.e. 0–255 decimal) in conjunction with a threshold of 180 (decimal), such that if the random number exceeds the predetermined threshold, the "U/S" bit is unset; otherwise, the "U/S" bit is set. To achieve a 90% expected percentage of unset bit, the programmable threshold can be raised to 205 (decimal). The initialized page tables are written to both shadow memory 210 and main memory 111. A listing of the function initializeTable ( ) is included in Appendix A to provide an example of a C++ program segment which implements table initialization for the first level and second level page tables.

Figure 5A:
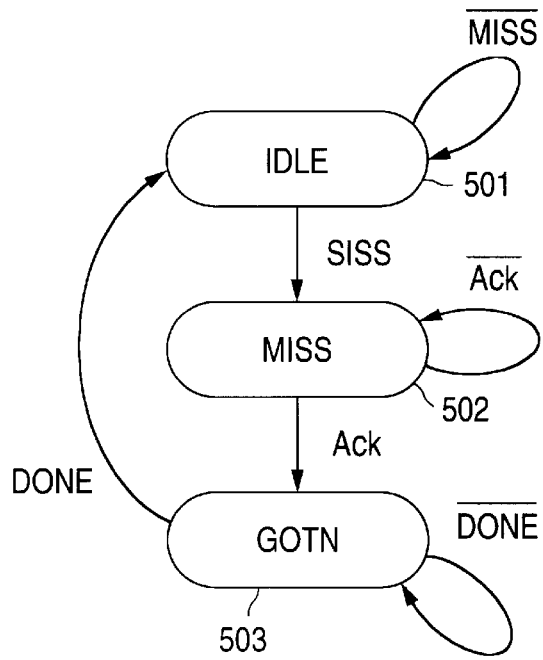
FIG. 5a shows a state machine 500 in I-cache requester 209.

I-cache requester 209, ITB requester 208, DTB requester 207 and DCR requester 206a are each controlled by state machines. In this embodiment, a write-back cache is implemented and a write buffer is implemented, so that DCW requester 206b and I/O requester 203 do not wait for completion of their write transactions. Thus, DCW requester 206a and I/O requester 203 are not explicitly provided a state machine. FIG. 5a shows the state machine 500 of I-cache requester 209. As shown in FIG. 5a, I-cache requester 209 waits in idle state 501 until a miss in instruction cache 109 occurs (generated by the random process described below). When such a miss occurs, I-cache requester 209 enters miss state 502. In miss state 502, I-cache requester 209 waits for an acknowledgement message from secondary cache RTL model 202 indicating that the requested data is available on system bus 104. When the acknowledgement message from secondary cache RTL model 202 is received, I-cache requester 209 enters data ("GotN") state 503, where I-cache requester 209 remains for the number of system clock periods necessary to refill one line of I-cache 109. I-cache requester 209 then returns to idle state 501.

Figure 5B:
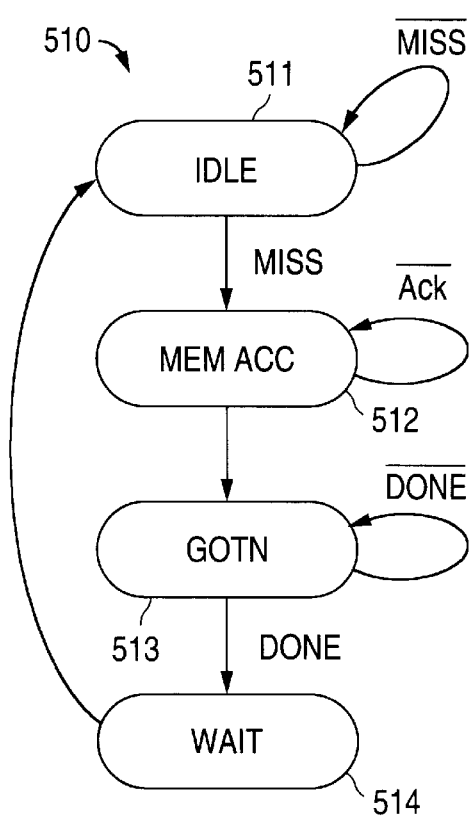

FIG. 5b shows state machine 510 of DCR requester 206a. As shown in FIG. 5b, DCR requester 206a waits in idle state 511 until a miss in data cache 106 occurs (generated by the random process described below). When such a miss occurs, DCR requester 206a enters memory access ("memacc") state 512. In memacc state 512, DCR requester 206a waits for an acknowledgement message from secondary cache RTL model 202 indicating that the requested data is available on system bus 104. When the acknowledgement message from secondary cache RTL model 202 is received, DCR requester 206a enters data ("GotN") state 513, where DCR requester 206a remains for the number of system clock periods necessary to refill one line of data cache 106. In this embodiment, DCR requester 206a enters wait state 514 for one system clock period after exiting data state 513.

Figure 5C:
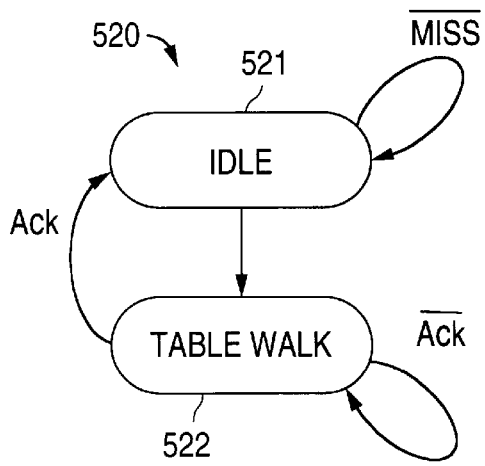
FIG. 5c shows a state machine 520 which is applicable to both ITB requester 208 and DTB requester 207.

The state machines for ITB requester 208 and DTB requester 207 are substantially similar. FIG. 5c shows a state machine 520 which is applicable to both ITB requester 208 and DTB requester 207. As shown in FIG. 5c, state machine 520 includes two states: idle state 521 and "table walk" state 522. From idle state 521, the TLB RTL model (i.e. either DTB 207 and ITB 208) enters table walk state 522 when access to a page table is required. The TLB RTL model remains in table walk state 522 until an acknowledgement message is received from the secondary cache RTL model 202 indicating that the data or instruction address translation is complete.

In the present embodiment, from their respective idle states, I-cache requester 209, DCR requester 206a, and DCW requester 206b each generate a random secondary cache access request or memory access request by comparing a randomly generated 8 bit-random value with a user programmable threshold ("access frequency"). Such a random secondary cache access request is generated when the 8-bit random number exceeds the predetermined access frequency. This programmable threshold allows I-cache requester 209, DCR requester 206a, and DCW requester 206b to be each simulated under different secondary cache or memory access frequencies. In addition, I-cache requester 209, DCR requester 206a, and DCW requester 206b each generate a random address for the cache or memory access. The present embodiment generates this random address using a programmable base index, a programmable index range, a programmable tag and a programmable tag range. In this manner, each module can be individually programmed to access certain address ranges, which may or may not overlap address ranges accessed by other modules. Similarly, in this embodiment, in their idle state, ITB requester 208 and DTB requester 207 each randomly generate access events according to their respective individually programmable frequencies. Unlike I-cache requester 209, DCR requester 206a and DCW requester 206b, neither ITB requester 208 nor DTB requester 207 generates an address of a programmable range. ITB requester 208 and DTB requester 207 randomly determine each of their cache or memory access requests to be a user access or a system access.

Referring again to FIG. 3, the member function GenNewState ( ) in each of secondary cache RTL model 202, main memory RTL model 211 and secondary controller RTL model 205, is called in both steps 303 and 305. As mentioned above, in this embodiment, secondary cache controller RTL model 205 includes I-cache requester 209, ITB requester 208, DTB requester 207, and DCR requester 206a and DCW requester 206b. The GenNewState ( ) member function of secondary controller RTL model 205 performs the tasks of (a) generating the next states of I-cache requester 209, ITB requester 208, DTB requester 207 and DCR requester 206a, according to the operations of their respective state machines discussed above; (b) setting state variables indicating pending access requests for system bus 104 from I-cache requester 209, DCR requester 206a, DCW requester 206b; and (c) setting other state variables pertaining to the current transaction (e.g. cacheable/non-cacheable, user/system access, current transaction address, byte marks etc.). A listing of the member function GenNewState ( ) is included in Appendix A to provide an example of a C++ program segment which generates new states for I-cache requester 209, ITB requester 208, DTB requester 207, DCR requester 206a and DCW requester 206b.

In step 304, the member function LdNewState ( ) in each of secondary cache RTL model 202, main memory RTL model 211 and secondary cache controller RTL model 205 is called to load a new state in each of these RTL models. Secondary cache controller RTL model 205 performs the tasks of: (a) checking for any error condition (e.g. too many cycles without acknowledgement from secondary cache RTL model 202); (b) assigning new states to the state machines of I-cache 209, DCR requester 206a, ITB requester 208 and DTB requester 207; (c) writing into shadow memory 210 any write access to main memory 111 from I/O requester 203 that is detected by the snoop logic; (d) generating randomly cache or memory access events and their associated addresses for I-cache requester 209, ITB requester 208, DTB requester 207, DCR requester 206a, and DCW requester 206b; and (e) updating shadow memory 211 by including write access generated by DCW requester 206b. A listing of the member function LdNewState ( ) is included in Appendix A to provide an example of a C++ program segment which loads into the state machines of each of I-cache requester 209, ITB requester 208, DTB requester 207, DCR requester 206a, and generates random cache or bus interface events and their associated addresses for I-cache requester 209, ITB requester 208, DTB requester 207, DCR requester 206a, DCW requester 206b, and I/O system requester 203.

As mentioned above, function check ( ) of secondary cache controller RTL model 205 verifies the data returned from the read access requests of I-cache requester 209 and DCR requester 206a with the corresponding data in shadow memory 210. For ITB requester 208 and DTB requester 207, function check ( ) (i) examines the PDE and PTE returned for integrity of the "present" bit, (ii) sets the access bit, (iii) checks for expected access violations, (iv) sets the "dirty" bit, (v) compares the PTE returned from secondary cache RTL model 202 with the PTE in cache controller RTL model 205, and (vi) replaces PDEs and PTEs with new randomly generated PDE and PTEs. A listing of the member function GenNewState ( ) is included in Appendix A to provide an example of a C++ program segment which performs the checking functions described above.

The present invention is applicable to the design of such computer systems as those described in the following copending U.S. patent applications, which are hereby incorporated into the present patent application by reference:

1. U.S. Pat. application, entitled "Unified Multi-function Operation Scheduler for Out-of-order Execution in a Superscaler Processor", by John G. Favor et al., Ser. No. 08/590,383, filed on the same day as the present application, assigned to NexGen Microsystems, Inc.
2. U.S. Pat. application, entitled "Out-of-order Processing with Operation Bumping to Reduce Pipeline Delay", by John G. Favor et al., Ser. No. 08/590,568, filed on the same day as the present application, assigned to NexGen Microsystems, Inc., now abandoned.
3. U.S. Pat. application, entitled "Scan Chain for Rapidly Identifying First or Second Objects of Selected Types in a Sequential List", by John G. Favor et al., Ser. No. 08/592,722, filed on the same day as the present application, assigned to NexGen Microsystems, Inc.
4. U.S. Pat. application, entitled "Self-Modifying Code Handling System", by Amos Ben-Meir et al., Ser. No. 08/592,150, filed on the same day as the present application, assigned to NexGen Microsystems, Inc.

5. U.S. Pat. application, entitled "Out-of-order Load/Store Execution Control", by John G. Favor et al., Ser. No. 08/592,209, filed on the same day as the present application, assigned to NexGen Microsystems, Inc.

6. U.S. Pat. application, entitled "Two Way Encoding Branching Method and System", by John G. Favor et al., Ser. No. 08/592,210, filed on the same day as the present application, assigned to NexGen Microsystems, Inc., now abandoned.

7. U.S. Pat. application, entitled "Instruction Vectoring and Decode", by John G. Favor et al., Ser. No. 08/592,208, filed on the same day as the present application, assigned to NexGen Microsystems, Inc., now abandoned.

8. U.S. Pat. application, entitled "RISC 86 Instruction Set", by John G. Favor et al., Ser. No. 08/592,151, filed on the same day as the present application, assigned to NexGen Microsystems, Inc., now abandoned.

9. U.S. Pat. application, entitled "Software Implementation of SMM", by John G. Favor et al., Ser. No. 08/592,149, filed on the same day as the present application, assigned to NexGen Microsystems, Inc., now abandoned.

10. U.S. Pat. application, entitled "Method for Analyzing Performance of a Microprocessor", by Warren G. Stapleton, Ser. No. 08/592,828, filed on the same day as the present application, assigned to NexGen Microsystems, Inc.

11. U.S. Pat. application, entitled "Instruction Predecode and Multiple Instruction Decode", by John G. Fervor et al, Ser. No. 08/592,207, filed on the same day as the present application, assigned to NexGen Microsystems, Inc., now abandoned.

12. U.S. Pat. application, entitled "Instruction Buffer Organization Method and System", by John G. Fervor et al, Ser. No. 08/593,765, filed on the same day as the present application, assigned to NexGen Microsystems, Inc., now abandoned.

The above detailed description is provided to illustrate the specific embodiments of the present invention and is not intended to be limiting. Numerous modifications and variations within the scope of the invention are possible. The present invention is defined by the appended claims.

08/592829

Appendix A

```
void HNBL2::initializeTables() {
  // Page table base addresses;
  // PDEBaseAddress can be changed by setCR3() call in rtg
  PDEBaseAddress(31,12) = random() & 0xfffff;
  PDEBaseAddress(4) = ((random() & 0xff) < 77);    // PCD (0.3 probability)
  PDEBaseAddress(3) = ((random() & 0xff) < 77);    // PWT (0.3 probability)
  PTEBaseAddress(31,12) = random() & 0xfffff;
  uint DiffIndex = 0xc + (random() & 0xf);
  PTEBaseAddress(DiffIndex) = !PDEBaseAddress(DiffIndex);

HVector PDEBase = PDEBaseAddress;
  HVector PTEBase = PTEBaseAddress;

ofstream TableFile("tables.out");
  TableFile << "PDEBase=" << hex << setw(8) << PDEBase << endl;
  TableFile << "PTEBase=" << setw(8) << PTEBase << endl;

// initialize PDE Table;
  for(int i=0;i<1024;i=i+1) {
    HVector PDE;
    PDE(31,12) = PTEBase(31,12);
    PDE(11,9) = 0x7 & random();              // Avail
    PDE(8,7) = 0x3 & random();               // reserved
    PDE(6) = 0x1 & random();                 // D
    PDE(5) = 0x1 & random();                 // A
    PDE(4) = 0x1 & random();                 // PCD
    PDE(3) = 0x1 & random();                 // PWT
    PDE(2) = ((0xff & random()) < 180);      // U/S (0.7 probability)
    PDE(1) = ((0xff & random()) < 180);      // R/W (0.7 probability)
    PDE(0) = ((0xff & random()) < 205);      // P   (0.8 probability)
    uint Address = PDEBase + i*4;
```

```
    SYS.MEM.writeWord(Address, PDE, 0xf);
    NBL2Module.ShadowRam.writeWord(Address, PDE, 0xf);

TableFile<<setw(9)<<hex<<Address;
    TableFile<<" "<<setw(9)<<hex<<PDE<<" ";
    printMemoryPte(TableFile, PDE);
    TableFile<<endl;
  }

// initialize PTE Table;
for(i=0;i<1024;i=i+1) {
    HVector PTE;
    PTE(31,12) = (HVector(random()))(31,12);
    PTE(11,9) = 0x7 & random();            // Avail
    PTE(8,7)  = 0x3 & random();            // reserved
    PTE(6)    = 0x1 & random();            // D
    PTE(5)    = 0x1 & random();            // A
    PTE(4)    = 0x1 & random();            // PCD
    PTE(3)    = 0x1 & random();            // PWT
    PTE(2)    = ((0xff & random()) < 180); // U/S (0.7 probability)
    PTE(1)    = ((0xff & random()) < 180); // R/W (0.7 probability)
    PTE(0)    = ((0xff & random()) < 205); // P   (0.8 probability)
    uint Address = PTEBase + i*4;
    SYS.MEM.writeWord(PTEBase + i*4, PTE, 0xf);
    NBL2Module.ShadowRam.writeWord(PTEBase + i*4, PTE, 0xf);

TableFile<<setw(9)<<hex<<Address;
    TableFile<<" "<<setw(9)<<hex<<PTE<<" ";
    printMemoryPte(TableFile, PTE);
    TableFile<<endl;
  }
} void HNBL2::ldNewState() { if(!NBL2) {
    return;
  }
  else {
    if ((Cycle%100000) == 0x0) {
      cout <<
        "Completed "<< dec << Cycle << hex <<
        " Cycles of NBL2 Testing...." << endl;
      cerr <<
        "Completed "<< dec << Cycle << hex <<
        " Cycles of NBL2 Testing...." << endl;
    }
  }

// Check for No L2Ack Limit Exceeded;
  // *******************************;

// L2 Ack;
  uint L2Ack =
    L2_IRdAck || L2_DRdAck || L2_DWrAck || L2_IXlatAck || L2_DXlatAck;

// Request to L2 Pending;
  uint ReqToL2Pending =
    IC_RdBusReq || DC_RdBusReq || DC_WrBusReq || ITB_XlatReq || DTB_XlatReq;
```

```
// Set LastL2AckCycle to current cycle;
if (L2Ack || NBReqTALed_W) {
  LastL2AckCycle = Cycle;
} if (ReqToL2Pending && ((Cycle - LastL2AckCycle) > NBL2NoL2AckLimit)) {
  cout <<
    "\nError: No L2 Ack Limit (" << dec <<
    NBL2NoL2AckLimit << ") Exceeded, Cycle=" << Cycle << endl;
  cerr <<
    "\nError: No L2 Ack Limit (" << dec <<
    NBL2NoL2AckLimit << ") Exceeded, Cycle=" << Cycle << endl;
  error("Error: Exiting Run....");
}

// Delayed Reset (Used for loading SR5);
ResetDly2 = ResetDly1;
ResetDly1 = CHP.IO_Reset;

// Remember cycle number at synchronization point.
// Start times for future transactions are expressed relative to
// this point (when requesters are reading from script files).
if (NBL2Synced) {
  SyncCycle = Cycle + 2;
  cout << "Synced at cycle: " << dec << SyncCycle << hex << endl;
}

ICState = ICNextState;
DCRState = DCRNextState;
ITBState = ITBNextState;
DTBState = DTBNextState;

// Update Shadow RAM on Snoop Block Writes that hit in L2.
// Done only in NBL2 environment;
if (WriteToShadow_W) {
  if (OctCnt_W == 0x0)
    ShadowRam.writeOctet(
      SYS.MEM_XferAddr_W,
      SYS.PAD_AD,
      SYS.MEM_ByteMarks_R);
  else
    ShadowRam.writeOctet(
      SYS.MEM_XferAddr_W,
      SYS.PAD_AD,
      0xff);
} if (L2_IRdAck || ICStartMiss) {
  ICOctNumCnt = L2_IRdAck ? HVector(ICOctNumCnt - 1)(1,0) : 0x3;
} if (L2_DRdAck || DCRStartMiss) {
  DCROctNumCnt = L2_DRdAck ? HVector(DCROctNumCnt + 1)(1,0) : 0x0;
}

// IC Requester;
// ************;

if(NBL2ICEnable) {
  // random;
  if(NBL2ICRandom) {
    if((Cycle > EndOfResetCycle) && (ICNextState==IDLE) &&
       ((random()&0xff)<NBL2ICFrequency)) {
```

```
      ++ICCounter;
      CurrentICTransaction_StartCycle = Cycle;
      ICStartMiss=1;
      uint Address =
         randomAddress(NBL2ICRandomIndexBase,
                       NBL2ICRandomIndexRange,
                       NBL2ICRandomTagBase,
                       NBL2ICRandomTagRange);
      CurrentICTransaction_RdAddr = Address & 0xffffffe0;
      CurrentICTransaction_RdNonC = 0x1 & random();
    }
    else {
      ICStartMiss=0;
    }
  }
  // read from file;
  else {
    // If synced, allow IC to continue making requests.
    if (NBL2Synced)
      ICWaitForSync = 0;

if((Cycle > EndOfResetCycle) && (ICState==IDLE) &&
       (Cycle >= (NextICTransaction_Offset + SyncCycle)) &&
       (NextICTransaction_Offset != -1) &&
       !NBL2ICFile.eof() && !ICWaitForSync) {
      if (NextICTransaction_Offset >= 0) {
        ++ICCounter;
        CurrentICTransaction_StartCycle = Cycle;
        ICStartMiss=1;
        uint Address;
        NBL2ICFile >> hex >> Address;
        CurrentICTransaction_RdAddr = Address;
        CurrentICTransaction_RdAddr &= 0xffffffe0;
        NBL2ICFile >> hex >> CurrentICTransaction_RdNonC;
      }
      else if (NextICTransaction_Offset == -2) {
        ICWaitForSync = 1;
      }
      if(!NBL2ICFile.eof()) {
        NBL2ICFile >> NextICTransaction_Offset;
      }
      else { // no more transactions in file
        NextICTransaction_Offset = -1;
      }
    }
    else {
      ICStartMiss=0;
    }
  }
}

// DCR Requester;
// *************;

if(NBL2DCREnable) {
  if(NBL2DCRRandom) { // random
    if((Cycle > EndOfResetCycle) && (DCRNextState==IDLE) &&
       ((random()&0xff)<NBL2DCRFrequency)) {
      ++DCRCounter;
      CurrentDCRTransaction_StartCycle = Cycle;
      DCRStartMiss=1;
      CurrentDCRTransaction_RdByteMark = 0xff & random();
      CurrentDCRTransaction_RdNonC = 0x1 & random();
      CurrentDCRTransaction_RdSpecMem = 0;
      uint Address =
```

```
        randomAddress(NBL2DCRRandomIndexBase,
                      NBL2DCRRandomIndexRange,
                      NBL2DCRRandomTagBase,
                      NBL2DCRRandomTagRange);
        CurrentDCRTransaction_RdAddr = Address & 0xfffffff8;
      }
      else {
        DCRStartMiss=0;
      }
    }
    else { // read from file
      if (NBL2Synced)
        DCRWaitForSync = 0;

if((Cycle > EndOfResetCycle) && (DCRState==IDLE) &&
         (Cycle >= (NextDCRTransaction_Offset + SyncCycle)) &&
         (NextDCRTransaction_Offset != -1) &&
         !NBL2DCRFile.eof() && !DCRWaitForSync) {
        if (NextDCRTransaction_Offset >= 0) {
          ++DCRCounter;
          CurrentDCRTransaction_StartCycle = Cycle;
          DCRStartMiss=1;
          uint Address;
          NBL2DCRFile >> hex >> Address;
          CurrentDCRTransaction_RdAddr = Address;
          CurrentDCRTransaction_RdAddr &= 0xffffffe0;
          NBL2DCRFile >> hex >> CurrentDCRTransaction_RdByteMark;
          NBL2DCRFile >> hex >> CurrentDCRTransaction_RdNonC;
          NBL2DCRFile >> hex >> CurrentDCRTransaction_RdSpecMem;
        }
        else if (NextDCRTransaction_Offset == -2) {
          DCRWaitForSync = 1;
        }
        if(!NBL2DCRFile.eof()) {
          NBL2DCRFile >> dec >> NextDCRTransaction_Offset;
        }
        else { // no more transactions in file
          NextDCRTransaction_Offset = -1;
        }
      }
      else {
        DCRStartMiss=0;
      }
    }
  }

// DC Write Requester;
// ******************;

if(NBL2DCWEnable) {
  if(NBL2DCWRandom) { // random
    if((Cycle > EndOfResetCycle) && !CurrentDCWTransaction_StV &&
       ((random()&0xff)<NBL2DCWFrequency)) {
      ++DCWCounter;
      CurrentDCWTransaction_StartCycle = Cycle;
      CurrentDCWTransaction_StV = 1;
      uint Address =
         randomAddress(NBL2DCWRandomIndexBase,
                       NBL2DCWRandomIndexRange,
                       NBL2DCWRandomTagBase,
                       NBL2DCWRandomTagRange);
      CurrentDCWTransaction_StSpecMem = 0; // no IO for now
      CurrentDCWTransaction_StHitW = 0x1 & random();
      if(!matchL2(Address)) // maintain L1 subset of L2
        CurrentDCWTransaction_StHitW = 0;
```

```
            CurrentDCWTransaction_StBlkState = 0x1 & random();
            CurrentDCWTransaction_StWriteThru = 0x1 & random();
            CurrentDCWTransaction_StCacheDis = 0x1 & random();
            CurrentDCWTransaction_StByteMark = 0xff & random();
            CurrentDCWTransaction_StAddress = Address & 0xfffffff8;
            CurrentDCWTransaction_StData.Bytes[7] = 0xff & random();
            CurrentDCWTransaction_StData.Bytes[6] = 0xff & random();
            CurrentDCWTransaction_StData.Bytes[5] = 0xff & random();
            CurrentDCWTransaction_StData.Bytes[4] = 0xff & random();
            CurrentDCWTransaction_StData.Bytes[3] = 0xff & random();
            CurrentDCWTransaction_StData.Bytes[3] = 0xff & random();
            CurrentDCWTransaction_StData.Bytes[2] = 0xff & random();
            CurrentDCWTransaction_StData.Bytes[0] = 0xff & random();
         }
      }
      else { // read from file
         // If synced, allow DCW to continue making requests.
         if (NBL2Synced) {
            DCWWaitForSync = 0;
            while (NextDCWTransaction_Offset < -2) {
               if (NextDCWTransaction_Offset == -3) { // setline command
                  uint Data;
                  NBL2DCWFile >> hex >> Data;
                  FullAddress = Data;
                  NBL2DCWFile >> hex >> LineState;
                  NBL2DCWFile >> hex >> Randomize;
                  getFourOctets(
                     NBL2DCWFile, Randomize, Octet0, Octet1, Octet2, Octet3);
                  flushline(FullAddress); // flush line if DIRTY
                  switch (LineState) {
                     case 0: // Absent; write octets in scrambled order
                        setL2(FullAddress, LineState, Octet2, Octet0, Octet3, Octet1);
                        break;
                     case 1: // Shared
                     case 2: // Owned
                     case 3: // Dirty
                        setL2(FullAddress, LineState, Octet0, Octet1, Octet2, Octet3);
                        break;
                  }
                  FullAddress(4,3) = 0x0;
                  ShadowRam.writeOctet(FullAddress, Octet0, 0xff);
                  FullAddress(4,3) = 0x1;
                  ShadowRam.writeOctet(FullAddress, Octet1, 0xff);
                  FullAddress(4,3) = 0x2;
                  ShadowRam.writeOctet(FullAddress, Octet2, 0xff);
                  FullAddress(4,3) = 0x3;
                  ShadowRam.writeOctet(FullAddress, Octet3, 0xff);
                  if (LineState != 0x3) { // new state not DIRTY
                     FullAddress(4,3) = 0x0;
                     SYS.MEM.writeOctet(FullAddress, Octet0, 0xff);
                     FullAddress(4,3) = 0x1;
                     SYS.MEM.writeOctet(FullAddress, Octet1, 0xff);
                     FullAddress(4,3) = 0x2;
                     SYS.MEM.writeOctet(FullAddress, Octet2, 0xff);
                     FullAddress(4,3) = 0x3;
                     SYS.MEM.writeOctet(FullAddress, Octet3, 0xff);
                  }
               }
               else if (NextDCWTransaction_Offset == -4) { // setCR3 command
                  uint Data;
                  NBL2DCWFile >> hex >> Data;
                  CHP.L2.CR3_R = Data;
                  PDEBaseAddress = Data;
               }
               else if (NextDCWTransaction_Offset == -5) { // exit command
```

```
    warning("Test Completed successfully.");
    ExitFlag = 1;
    break;
}
else if (NextDCWTransaction_Offset == -6) { // print command
    char str[120];
    NBL2DCWFile.getline(str, 118);
    cout << str << endl;
}
else if (NextDCWTransaction_Offset == -7) { // AssertL2State command
    uint Data;
    NBL2DCWFile >> hex >> Data;
    FullAddress = Data;
    NBL2DCWFile >> hex >> LineState;
    AssertL2State(FullAddress, LineState);
}
else if (NextDCWTransaction_Offset == -8) { // AssertL2Data command
    uint Data;
    NBL2DCWFile >> hex >> Data;
    FullAddress = Data;
    getFourOctets(NBL2DCWFile, 0, Octet0, Octet1, Octet2, Octet3);
    AssertL2Data(FullAddress, Octet0, Octet1, Octet2, Octet3);
}
else if (NextDCWTransaction_Offset == -9) { // AssertMemData command
    uint Data;
    NBL2DCWFile >> hex >> Data;
    FullAddress = Data;
    getFourOctets(NBL2DCWFile, 0, Octet0, Octet1, Octet2, Octet3);
    AssertMemData(FullAddress, Octet0, Octet1, Octet2, Octet3);
}
    NBL2DCWFile >> dec >> NextDCWTransaction_Offset;
  }
} if((Cycle > EndOfResetCycle) && !CurrentDCWTransaction_StV &&
   (Cycle >= (NextDCWTransaction_Offset + SyncCycle)) &&
   (NextDCWTransaction_Offset != -1) &&
   !NBL2DCWFile.eof() && !DCWWaitForSync) {
  if (NextDCWTransaction_Offset >= 0) {
    ++DCWCounter;
    CurrentDCWTransaction_StartCycle = Cycle;
    CurrentDCWTransaction_StV = 1;
    uint Address;
    NBL2DCWFile >> hex >> Address;
    CurrentDCWTransaction_StAddress = Address & 0xfffffff8;
    NBL2DCWFile >> hex >> CurrentDCWTransaction_StByteMark;
    NBL2DCWFile >> hex >> CurrentDCWTransaction_StSpecMem;
    NBL2DCWFile >> hex >> CurrentDCWTransaction_StHitW;
    NBL2DCWFile >> hex >> CurrentDCWTransaction_StWriteThru;
    NBL2DCWFile >> hex >> CurrentDCWTransaction_StCacheDis;
    NBL2DCWFile >> hex >> CurrentDCWTransaction_StBlkState;

uint Data;
    NBL2DCWFile >>hex >> Data;
    HVector UpperWord = Data;
    NBL2DCWFile >>hex >> Data;
    HVector LowerWord = Data;

CurrentDCWTransaction_StData.Bytes[7]=UpperWord(31,24);
    CurrentDCWTransaction_StData.Bytes[6]=UpperWord(23,16);
    CurrentDCWTransaction_StData.Bytes[5]=UpperWord(15,8);
    CurrentDCWTransaction_StData.Bytes[4]=UpperWord(7,0);

CurrentDCWTransaction_StData.Bytes[3]=LowerWord(31,24);
    CurrentDCWTransaction_StData.Bytes[2]=LowerWord(23,16);
    CurrentDCWTransaction_StData.Bytes[1]=LowerWord(15,8);
```

```
      CurrentDCWTransaction_StData.Bytes[0]=LowerWord(7,0);
    }
    else if (NextDCWTransaction_Offset == -2) {
      DCWWaitForSync = 1;
    }
    if(!NBL2DCWFile.eof()) {
      NBL2DCWFile >> dec >> NextDCWTransaction_Offset;
    }
    else { // no more transactions in file
      NextDCWTransaction_Offset = -1;
    }
  }
} if(L2_DSnoop && NBL2DCWRandom &&
    ((L2_SnoopAddr&0xffffffe0) ==
     (CurrentDCWTransaction_StAddress&0xffffffe0))) {
  CurrentDCWTransaction_StHitW = 0x0;
}

// KRS - the following code compensates for the fact that
// there is a "window" between an L2_DSnoop and the corresponding
// L2 tag update;
ExtInv =
    (SnpCurrentState_W == CHP.L2.U_SNPL2TAGCMP) &&
    L2_DSnoop && L2_DSnoopInv;

IntInv =
    (SnpCurrentState_W != CHP.L2.U_SNPL2TAGCMP) &&
    L2_DSnoop && L2_DSnoopInv;

if (ExtInv && NBL2DCWRandom) {
  ExtInvInProg = 1;
  ExtSnoopAddr = L2_SnoopAddr & 0xffffffe0;
} if (IntInv && NBL2DCWRandom) {
  IntInvInProg = 1;
  IntSnoopAddr = L2_SnoopAddr & 0xffffffe0;
} if (!SYS.PAD_CTWE_ && (SYS.PAD_SRCLK == 0x7)) {
  if (ExtInvInProg &&
      ((SYS.PAD_CADDR & 0xfffe0) == (ExtSnoopAddr & 0xfffe0))) {
    ExtInvInProg = 0;
  }
  if (IntInvInProg &&
      ((SYS.PAD_CADDR & 0xfffe0) == (IntSnoopAddr & 0xfffe0))) {
    IntInvInProg = 0;
  }
} if (ExtInvInProg &&
    ((CurrentDCWTransaction_StAddress & 0xffffffe0) == ExtSnoopAddr)) {
  CurrentDCWTransaction_StHitW = 0;
} if (IntInvInProg &&
    ((CurrentDCWTransaction_StAddress & 0xffffffe0) == IntSnoopAddr)) {
  CurrentDCWTransaction_StHitW = 0;
}
}
```

```
// ITB Requester;
// *************;

if(NBL2ITBEnable) {
  if(NBL2ITBRandom) { // random
    if((Cycle > EndOfResetCycle) && (ITBNextState==IDLE) &&
       ((random()&0xff)<NBL2ITBFrequency)) {
      ++ITBCounter;
      CurrentITBTransaction_StartCycle = Cycle;
      ITBStartMiss=1;
      CurrentITBTransaction_Addr = random();
      CurrentITBTransaction_U = 0x1 & random();
    }
    else {
      ITBStartMiss=0;
    }
  }
  else { // read from file
    if (NBL2Synced)
      ITBWaitForSync = 0;

if((Cycle > EndOfResetCycle) && (ITBState==IDLE) &&
       (Cycle >= (NextITBTransaction_Offset + SyncCycle)) &&
       (NextITBTransaction_Offset != -1) &&
       !NBL2ITBFile.eof() && !ITBWaitForSync) {
      if (NextITBTransaction_Offset >= 0) {
        ++ITBCounter;
        CurrentITBTransaction_StartCycle = Cycle;
        ITBStartMiss=1;
        uint Address;
        NBL2ITBFile >> hex >> Address;
        CurrentITBTransaction_Addr = Address;
        NBL2ITBFile >> hex >> CurrentITBTransaction_U;
      }
      else if (NextITBTransaction_Offset == -2) {
        ITBWaitForSync = 1;
      }
      if(!NBL2ITBFile.eof()) {
        NBL2ITBFile >> dec >> NextITBTransaction_Offset;
      }
      else // no more transactions in file
        NextITBTransaction_Offset = -1;
    }
    else {
      ITBStartMiss=0;
    }
  }
}

// DTB Requester;
// *************;

if(NBL2DTBEnable) {
  if(NBL2DTBRandom) { // random
    if((Cycle > EndOfResetCycle) && (DTBNextState==IDLE) &&
       ((random()&0xff)<NBL2DTBFrequency)) {
      ++DTBCounter;
      CurrentDTBTransaction_StartCycle = Cycle;
      DTBStartMiss=1;
      CurrentDTBTransaction_Addr = random();
      CurrentDTBTransaction_U = 0x1 & random();
      CurrentDTBTransaction_XlatWr = 0x1 & random();
      CurrentDTBTransaction_RUX_WP = 0x1 & random();
    }
    else {
```

```
        DTBStartMiss=0;
      }
    }
    else { // read from file
      if (NBL2Synced)
        DTBWaitForSync = 0;

if((Cycle > EndOfResetCycle) && (DTBState==IDLE) &&
          (Cycle >= (NextDTBTransaction_Offset + SyncCycle)) &&
          (NextDTBTransaction_Offset != -1) &&
          !NBL2DTBFile.eof() && !DTBWaitForSync) {
        if (NextDTBTransaction_Offset >= 0) {
          ++DTBCounter;
          CurrentDTBTransaction_StartCycle = Cycle;
          DTBStartMiss=1;
          uint Address;
          NBL2DTBFile >> hex >> Address;
          CurrentDTBTransaction_Addr = Address;
          NBL2DTBFile >> hex >> CurrentDTBTransaction_U;
          NBL2DTBFile >> hex >> CurrentDTBTransaction_XlatWr;
          NBL2DTBFile >> hex >> CurrentDTBTransaction_RUX_WP;
        }
        else if (NextDTBTransaction_Offset == -2) {
          DTBWaitForSync = 1;
        }
        if(!NBL2DTBFile.eof()) {
          NBL2DTBFile >> dec >> NextDTBTransaction_Offset;
        }
        else // no more transactions in file
          NextDTBTransaction_Offset = -1;
      }
      else {
        DTBStartMiss=0;
      }
    }
  }

// Update ShadowRam on DC writes;
  // ****************************;

if((L2_DWrEAck && DC_WrWrBck && DC_WrL1Hit || L2_DWrAck) &&
      CurrentDCWTransaction_StV_W) {
    HVector Address = DC_WrAddr;
    for(int i=0;i<8;++i) {
      if(CurrentDCWTransaction_StByteMark & (0x1<<i)) {
        ShadowRam.writeByte(Address+i, STQ_WrData.Bytes[i]);
      }
    }
    CurrentDCWTransaction_StV = 0;
  }
} void HNBL2::genNewState() { if(!NBL2)
    return;

// Detect when all NBL2 requesters are synchronized.
  // ADD SNOOPS EVENTUALLY.
  NBL2Synced =
    CHP.L2.StateIDLE &&
    ICWaitForSync && DCRWaitForSync && DCWWaitForSync &&
    ITBWaitForSync && DTBWaitForSync && !IC_RdBusReq &&
    !DC_RdBusReq && !DC_WrBusReq && !ITB_XlatReq && !DTB_XlatReq;
```

```
// KRS;
SnpCurrentState_W = SYS.CHP.L2.SnpCurrentState_R;

WriteToShadow_W =
  (SYS.MEM_State_R == SYS.MEMDATA) && !SYS.MEM_RdNotWr_R &&
  SYS.PAD_GXACK && SYS.PAD_CLK && SYS.NBL2 && !SYS.SYS_ChpNotSnp_R &&
  SYS.SNP_BlkWrInL2_R;
OctCnt_W = SYS.MEM_OctCnt_R;

CurrentDCWTransaction_StV_W = CurrentDCWTransaction_StV;

// NB Request TALed;
NBReqTALed_W =
  ((SYS.MEM_State_R == SYS.MEMDATA) ||
   (SYS.SIO_State_R == SYS.SIODATA)) &&
  SYS.PAD_GTAL && SYS.PAD_GXACK && SYS.PAD_CLK;

// IC;
// **;

switch (ICState) {
  case IDLE:
    if (ICStartMiss) {
      ICNextState = MISSP;
    }
    else {
      ICNextState = IDLE;
    }
    break;
  case MISSP:
    if (L2_IRdAck) { // wait for acknowledge
      ICNextState = GOTN;
    }
    else {
      ICNextState = MISSP;
    }
    break;
  case GOTN:
    if (ICOctNumCnt == 0x3) {
      ICNextState = IDLE;
    }
    else {
      ICNextState = GOTN;
    }
    break;
  default:
    error("Bad State in IC, State=", ICState);
}

IC_RdBusReq = ICStartMiss || (ICState == MISSP);
IC_RdNonC = CurrentICTransaction_RdNonC;
IC_RdAddr = CurrentICTransaction_RdAddr;

// DCR;
// ***;

switch (DCRState) {
  case IDLE:
    if (DCRStartMiss) {
      DCRNextState = MEMACC;
    }
    else {
      DCRNextState = IDLE;
    }
```

```
      break;
    case MEMACC:
      if (L2_DRdAck) { // wait for acknowledge
        if(CurrentDCRTransaction_RdNonC)
          DCRNextState = WAIT;
        else
          DCRNextState = GOTN;
      }
      else {
        DCRNextState = MEMACC;
      }
      break;
    case GOTN:
      if (DCROctNumCnt == 0x0) {
        DCRNextState = WAIT;
      }
      else {
        DCRNextState = GOTN;
      }
      break;
    case WAIT:
      DCRNextState = IDLE;
      break;
    default:
      error("Bad State in DCR, State=", DCRState);
}

DC_RdBusReq = DCRStartMiss || (DCRState == MEMACC);
DC_RdNonC = CurrentDCRTransaction_RdNonC;
DC_RdAddr = CurrentDCRTransaction_RdAddr;
DC_RdSpec = CurrentDCRTransaction_RdSpecMem;
DC_RdByteMarks = CurrentDCRTransaction_RdByteMark;

// DC Write Requester;
// ******************;

// Write Bus Request;
DC_WrBusReq =
  CurrentDCWTransaction_StV;

// Write Hit in L1 Cache;
DC_WrL1Hit = CurrentDCWTransaction_StHitW;

// Write is to write back page versus write-thru;
DC_WrWrBck =
  (CurrentDCWTransaction_StBlkState || !CurrentDCWTransaction_StHitW) &&
  !CurrentDCWTransaction_StWriteThru &&
  !CurrentDCWTransaction_StCacheDis;

// Write is Non Cacheable;
DC_WrNonC = CurrentDCWTransaction_StCacheDis;

// Write is IO or other special store (i.e. Halt or Shutdown);
DC_WrSpec = CurrentDCWTransaction_StSpecMem;

// Write Address [31:3];
DC_WrAddr = CurrentDCWTransaction_StAddress;

// Write Byte Marks [7:0];
DC_WrByteMarks = CurrentDCWTransaction_StByteMark;

// Write Data
STQ_WrData = CurrentDCWTransaction_StData;
```

```
// ITB State Machine;
// *****************;

switch (ITBState) {
  case IDLE:
    if (ITBStartMiss) {
      ITBNextState = TABLEWALK;
    }
    else {
      ITBNextState = IDLE;
    }
    break;
  case TABLEWALK:
    if (L2_IXlatAck) {
      ITBNextState = IDLE;
    }
    else {
      ITBNextState = TABLEWALK;
    }
    break;
  default:
    error("Bad State in ITB, State=", ITBState);
}

// DTB State Machine;
// *****************;

switch (DTBState) {
  case IDLE:
    if (DTBStartMiss) {
      DTBNextState = TABLEWALK;
    }
    else {
      DTBNextState = IDLE;
    }
    break;
  case TABLEWALK:
    if (L2_DXlatAck) {
      DTBNextState = IDLE;
    }
    else {
      DTBNextState = TABLEWALK;
    }
    break;
  default:
    error("Bad State in DTB, State=", DTBState);
}

// Table Walk;
// **********;

// ITB
// Request;
ITB_XlatReq = ITBStartMiss || (ITBState == TABLEWALK);

// Translation for User Access;
ITB_XlatU = CurrentITBTransaction_U;

// Translation Address (Linear page Number) [31:12];
ITB_XlatAddr = CurrentITBTransaction_Addr;

// DTB
// Request;
DTB_XlatReq = DTBStartMiss || (DTBState == TABLEWALK);
```

```
// Translation for User Access;
DTB_XlatU = CurrentDTBTransaction_U;

// Translation for Write Access
DTB_XlatWr = CurrentDTBTransaction_XlatWr;

// Translation Address (Linear page Number) [31:12];
DTB_XlatAddr = CurrentDTBTransaction_Addr;

// Write protect
RUX_WP = CurrentDTBTransaction_RUX_WP;

// Cache disable
RUX_CD = 0;

// CR3 and SR5;
// ***********;

if (ResetDly2 && !ResetDly1) {
  RUX_WrCR3 = 0;
  RUX_WrSR5 = 1;
  RUX_SRWrData = 0x0;
  RUX_SRWrData(2) = NBL2CacheDisable;
  RUX_SRWrData(5) = NBL2WrAllocDisable;
  RUX_SRWrData(6) = NBL2WBDisable;
  RUX_SRWrData(7) = NBL2SnoopDisable;
  RUX_SRWrData(14) = NBL2LockDisable;
}
else {
  RUX_WrCR3 = 1;
  RUX_WrSR5 = 0;
  RUX_SRWrData = PDEBaseAddress;
}
}
```

```
void HNBL2::check() {
  // Check IC fills;
  // **************;

if(L2_IRdAck) {
    HVector Address = CurrentICTransaction_RdAddr;
    Address(4,3) = ICOctNumCnt;
    HOctet ExpectedData;
    ShadowRam.readOctet(Address, ExpectedData);
    if(L2_RdData != ExpectedData) {
      if (_TransactionDebug) {
        TransactionFile << dec << Cycle << " Error: ICFill ";
        printAddress(TransactionFile, Address, SYS.EffL2CacheSize);
        printData(TransactionFile, L2_RdData);
        TransactionFile << " Expected ";
        printData(TransactionFile, ExpectedData);
        TransactionFile << endl;
      }
      ++Errors;
    }
  }

// Check DCR fills;
  // ***************;

if(L2_DRdAck) {
    HVector Address = CurrentDCRTransaction_RdAddr;
    Address(4,3) =
      (IO_OldNBOrder ?
        (DCROctNumCnt ^ Address(4,3)) : (DCROctNumCnt + Address(4,3)));
    HOctet ExpectedData;
    ShadowRam.readOctet(Address, ExpectedData);
    uint Different = 0;
    for(int i=0;i<8;++i) {
      if(CurrentDCRTransaction_RdByteMark & (0x1<<i)) {
        if(L2_RdData.Bytes[i] != ExpectedData.Bytes[i]) {
          Different = 1;
        }
      }
    } if(Different) {
      if (_TransactionDebug) {
        TransactionFile << dec << Cycle << " Error: DCRFill ";
        printAddress(TransactionFile, Address, SYS.EffL2CacheSize);
        printData(TransactionFile, L2_RdData);
        TransactionFile << " Expected ";
        printData(TransactionFile, ExpectedData);
        TransactionFile << endl;
      }
      ++Errors;
    }
  }

// Check ITB translate requests;
  // ****************************;

if(L2_IXlatAck) {
    uint WritePDE = 0;
    uint WritePTE = 0;

// get PDE entry
    uint PDEIndex = HVector(CurrentITBTransaction_Addr)(31,22);
```

```
                          ∨ PDEBaseAddress
uint PDEAddress = (PDBP eAddress&0xfffff000) + (4 *    index);
HVector PDE = ShadowRam. eadWord(PDEAddress);
                       , readWord // cout<<hex<<"PDEAddress="<<PDEAddress<<" "<<"PDE=";
// printMemoryPte(cout,PDE);
// cout<<endl;

// get PTE entry
uint PTEIndex = HVector(CurrentITBTransaction_Addr)(21,12);
uint PTEAddress = (PDE&0xfffff000) + (4 * PTEIndex);
HVector PTE = ShadowRam.readWord(PTEAddress);

// cout<<hex<<"PTEAddress="<<PTEAddress<<" "<<"PTE=";
// printMemoryPte(cout,PTE);
// cout<<endl;

// Check returned P bit against expected PDE/PTE P bits;
if (L2_PteData(20) != (PDE(0) && PTE(0))) {
  if (_TransactionDebug) {
    TransactionFile << dec << Cycle << " Error: ITBXlat ";
    TransactionFile << " Present bit mismatch: " << endl;
    TransactionFile << "\tL2_PteData(20)=" << L2_PteData(20) << endl;
    TransactionFile << "\tExpected PDE(0)=" << PDE(0) << endl;
    TransactionFile << "\tExpected PTE(0)=" << PTE(0) << endl;
    TransactionFile <<
      "\tExpected PDE Address - " << hex << setw(8) << PDEAddress;
    TransactionFile << ", Expected PDEData = " << setw(8) << PDE << endl;
    TransactionFile <<
      "\tExpected PTE Address = " << setw(8) << PTEAddress;
    TransactionFile << ", Expected PTEData = " << setw(8) << PTE << endl;
  }
  ++Errors;
}

// check if PDE is present
if(PDE(0)) { // PDE was present
  // Record if PDE was written;
  WritePDE = !PDE(5);

// set accessed bit of PDE
  PDE = 0x20 | PDE;
  ShadowRam.writeWord(PDEAddress, PDE, 0xf);

// check if PTE is present
  if(PTE(0)) { // PTE present
    // check for mismatch on access violation
    uint Write = PTE(1)&&PDE(1);
    uint User = PTE(2)&&PDE(2);
    uint PrivViol = ITB_XlatU && !User;
    uint AccViol = PrivViol;
    if(AccViol != L2_AccViol) {
      if (_TransactionDebug) {
        TransactionFile << dec << Cycle << " Error: ITBXlat ";
        TransactionFile << "access violation has the wrong value"<<endl;
        TransactionFile << "\tExpected L2_AccViol=" << hex << AccViol;
        TransactionFile << ", Actual L2_AccViol=" <<  L2_AccViol << endl;
      }
      ++Errors;
    }

// if no access violation, update PTE access bit;
    if (!AccViol) {
      // Record if PTE was written;
      WritePTE = !PTE(5);

// set accessed bit of PTE
```

```
      PTE = 0x20 | PTE;

ShadowRam.writeWord(PTEAddress, PTE, 0xf);
    )

// check returned PTE
    if(!((L2_PteData(19,0) == PTE(31,12)) &&
         (L2_PteData(25) == PTE(6)) &&
         (L2_PteData(24) == PTE(3)) &&
         (L2_PteData(23) == (PTE(1)&&PDE(1))) &&
         (L2_PteData(22) == PTE(4)) &&
         (L2_PteData(21) == (PTE(2)&&PDE(2))) &&
         (L2_PteData(20) == PTE(0)))) {
      if (_TransactionDebug) {
        TransactionFile << dec << Cycle << " Error: ITBXlat ";
        TransactionFile << " Actual PTE=";
        printPteData(TransactionFile, L2_PteData);
        TransactionFile << endl;
        TransactionFile << "\tExpected PDE=";
        printMemoryPte(TransactionFile, PDE);
        TransactionFile << endl;
        TransactionFile <<
          "\tExpected PDE Address=" << setw(8) << PDEAddress;
        TransactionFile << ", Expected PDEData=" << setw(8) << PDE;
        TransactionFile << endl;
        TransactionFile << "\tExpected PTE=";
        printMemoryPte(TransactionFile, PTE);
        TransactionFile << endl;
        TransactionFile <<
          "\tExpected PTE Address=" << setw(8) << PTEAddress;
        TransactionFile << ", Expected PTEData=" << setw(8) << PTE;
        TransactionFile << endl;
      }
      ++Errors;
    }
  }
}

// Randomize PDE;
if (NBL2ITBRandom) {
  if (!WritePDE) {
    HVector NewPDE = PDE;
    NewPDE(6) = 0x1 & random();              // D
    NewPDE(5) = 0x1 & random();              // A
    NewPDE(4) = 0x1 & random();              // PCD
    NewPDE(3) = 0x1 & random();              // PWT
    NewPDE(2) = ((0xff & random()) < 180);   // U/S (0.7 probability)
    NewPDE(1) = ((0xff & random()) < 180);   // R/W (0.7 probability)
    NewPDE(0) = ((0xff & random()) < 205);   // P   (0.8 probability)
    if (SYS.l2Hit(PDEAddress)) {
      SYS.l2WriteByte(PDEAddress, NewPDE(7,0));
      if (SYS.l2State(PDEAddress) != HLineState_DIRTY) {
        SYS.MEM.writeByte(PDEAddress, NewPDE(7,0));
      }
    }
    else {
      SYS.MEM.writeByte(PDEAddress, NewPDE(7,0));
    }
    ShadowRam.writeByte(PDEAddress, NewPDE(7,0));
    if (_TransactionDebug) {
      TransactionFile << dec << Cycle << " Randomizing PDE on ITB Req: ";
      TransactionFile << " PDE Address=" << hex << setw(8) << PDEAddress;
      TransactionFile <<
        " NewPDEData=" << hex << setw(8) << NewPDE << endl;
    }
  }
}
```

```
    // Randomize PTE;
    if (!WritePTE) {
      HVector NewPTE = PTE;
      NewPTE(6) = 0x1 & random();           // D
      NewPTE(5) = 0x1 & random();           // A
      NewPTE(4) = 0x1 & random();           // PCD
      NewPTE(3) = 0x1 & random();           // PWT
      NewPTE(2) = ((0xff & random()) < 180); // U/S (0.7 probability)
      NewPTE(1) = ((0xff & random()) < 180); // R/W (0.7 probability)
      NewPTE(0) = ((0xff & random()) < 205); // P   (0.8 probability)
      if (SYS.l2Hit(PTEAddress)) {
        SYS.l2WriteByte(PTEAddress, NewPTE(7,0));
        if (SYS.l2State(PTEAddress) != HLineState_DIRTY) {
          SYS.MEM.writeByte(PTEAddress, NewPTE(7,0));
        }
      }
      else {
        SYS.MEM.writeByte(PTEAddress, NewPTE(7,0));
      }
      ShadowRam.writeByte(PTEAddress, NewPTE(7,0));
      if (_TransactionDebug) {
        TransactionFile << dec << Cycle << " Randomizing PTE on ITB Req: ";
        TransactionFile << " PTE Address=" << hex << setw(8) << PTEAddress;
        TransactionFile <<
          " NewPTEData=" << hex << setw(8) << NewPTE << endl;
      }
    }
  }
}

// Check DTB translate requests;
// ****************************;

if(L2_DXlatAck) {
  uint WritePDE = 0;
  uint WritePTE = 0;

// get PDE entry
  uint PDEIndex = HVector(CurrentDTBTransaction_Addr)(31,22);
  uint PDEAddress = (PDEBaseAddress&0xfffff000) + (4 * PDEIndex);
  HVector PDE = ShadowRam.readWord(PDEAddress);

// cout<<hex<<"PDEAddress="<<PDEAddress<<" "<<"PDE=";
  // printMemoryPte(cout,PDE);
  // cout<<endl;

// get PTE entry
  uint PTEIndex = HVector(CurrentDTBTransaction_Addr)(21,12);
  uint PTEAddress = (PDE(31,0)&0xfffff000) + (4 * PTEIndex);
  HVector PTE = ShadowRam.readWord(PTEAddress);

// cout<<hex<<"PTEAddress="<<PTEAddress<<" "<<"PTE=";
  // printMemoryPte(cout,PTE);
  // cout<<endl;

// Check returned P bit against expected PDE/PTE P bits;
  if (L2_PteData(20) != (PDE(0) && PTE(0))) {
    if (_TransactionDebug) {
      TransactionFile << dec << Cycle << " Error: DTBXlat ";
      TransactionFile << " Present bit mismatch: " << endl;
      TransactionFile << "\tL2_PteData(20)=" << L2_PteData(20) << endl;
      TransactionFile << "\tExpected PDE(0)=" << PDE(0) << endl;
      TransactionFile << "\tExpected PTE(0)=" << PTE(0) << endl;
      TransactionFile <<
```

```
            "\tExpected PDE Address = " << hex << setw(8) << PDEAddress;
    TransactionFile <<    Expected PDEData = " << setw(8) << PDE << endl;
    TransactionFile <<
            "\tExpected PTE Address = " << setw(8) << PTEAddress;
    TransactionFile << ", Expected PTEData = " << setw(8) << PTE << endl;
    }
    ++Errors;
}

// check if PDE is present
if(PDE(0)) { // PDE was present
    // Record if PDE was written;
    WritePDE = !PDE(5);

// set accessed bit of PDE
    PDE = 0x20 | PDE;
    ShadowRam.writeWord(PDEAddress, PDE, 0xf);

// check if PTE is present
    if(PTE(0)) { // PTE present
        // check for mismatch on access violation
        uint Write = PTE(1)&&PDE(1);
        uint User  = PTE(2)&&PDE(2);
        uint PrivViol = DTB_XlatU && !User;
        uint WrViol = (DTB_XlatU || RUX_WP) && DTB_XlatWr && !Write;
        uint AccViol = WrViol || PrivViol;
        if(AccViol != L2_AccViol) {
            if (_TransactionDebug) {
                TransactionFile << dec << Cycle << " Error: DTBXlat ";
                TransactionFile << "access violation has the wrong value"<<endl;
                TransactionFile << "\tExpected L2_AccViol=" << hex << AccViol;
                TransactionFile << ", Actual L2_AccViol=" <<  L2_AccViol << endl;
            }
            ++Errors;
        }

// if no access violation, update PTE accessed and dirty bits
        if (!AccViol) {
            // Record if PTE was written;
            WritePTE = !(PTE(5) && PTE(6));

// set accessed bit of PTE
            PTE = 0x20 | PTE;   // A bit

// set Dirty bit of PTE
            if(DTB_XlatWr) {
                PTE = 0x40 | PTE; // D bit
            }

ShadowRam.writeWord(PTEAddress, PTE, 0xf);
        }

// check returned PTE
        if(!((L2_PteData(19,0) == PTE(31,12)) &&
             (L2_PteData(25) == PTE(6)) &&
             (L2_PteData(24) == PTE(3)) &&
             (L2_PteData(23) == (PTE(1)&&PDE(1))) &&
             (L2_PteData(22) == PTE(4)) &&
             (L2_PteData(21) == (PTE(2)&&PDE(2))) &&
             (L2_PteData(20) == PTE(0)))) {
            if (_TransactionDebug) {
                TransactionFile << dec << Cycle << " Error: DTBXlat ";
                TransactionFile << " Actual PTE=";
                printPteData(TransactionFile, L2_PteData);
                TransactionFile << endl;
                TransactionFile << "\tExpected PDE=";
```

```
        printMemoryPte(TransactionFile, PDE);
        TransactionFile << endl;
        TransactionFile <<
          "\tExpected PDE Address=" << setw(8) << PDEAddress;
        TransactionFile << ", Expected PDEData=" << setw(8) << PDE;
        TransactionFile << endl;
        TransactionFile << "\tExpected PTE=";
        printMemoryPte(TransactionFile, PTE);
        TransactionFile << endl;
        TransactionFile <<
          "\tExpected PTE Address=" << setw(8) << PTEAddress;
        TransactionFile << ", Expected PTEData=" << setw(8) << PTE;
        TransactionFile << endl;
      }
      ++Errors;
    }
  }
}

// Randomize PDE;
if (NBL2DTBRandom) {
  if (!WritePDE) {
    HVector NewPDE = PDE;
    NewPDE(6) = 0x1 & random();            // D
    NewPDE(5) = 0x1 & random();            // A
    NewPDE(4) = 0x1 & random();            // PCD
    NewPDE(3) = 0x1 & random();            // PWT
    NewPDE(2) = ((0xff & random()) < 180); // U/S (0.7 probability)
    NewPDE(1) = ((0xff & random()) < 180); // R/W (0.7 probability)
    NewPDE(0) = ((0xff & random()) < 205); // P   (0.8 probability)
    if (SYS.l2Hit(PDEAddress)) {
      SYS.l2WriteByte(PDEAddress, NewPDE(7,0));
      if (SYS.l2State(PDEAddress) != HLineState_DIRTY) {
        SYS.MEM.writeByte(PDEAddress, NewPDE(7,0));
      }
    }
    else {
      SYS.MEM.writeByte(PDEAddress, NewPDE(7,0));
    }
    ShadowRam.writeByte(PDEAddress, NewPDE(7,0));
    if (_TransactionDebug) {
      TransactionFile << dec << Cycle << " Randomizing PDE on DTB Req: ";
      TransactionFile << " PDE Address=" << hex << setw(8) << PDEAddress;
      TransactionFile <<
        " NewPDEData=" << hex << setw(8) << NewPDE << endl;
    }
  }
}

// Randomize PTE;
if (!WritePTE) {
  HVector NewPTE = PTE;
  NewPTE(6) = 0x1 & random();            // D
  NewPTE(5) = 0x1 & random();            // A
  NewPTE(4) = 0x1 & random();            // PCD
  NewPTE(3) = 0x1 & random();            // PWT
  NewPTE(2) = ((0xff & random()) < 180); // U/S (0.7 probability)
  NewPTE(1) = ((0xff & random()) < 180); // R/W (0.7 probability)
  NewPTE(0) = ((0xff & random()) < 205); // P   (0.8 probability)
  if (SYS.l2Hit(PTEAddress)) {
    SYS.l2WriteByte(PTEAddress, NewPTE(7,0));
    if (SYS.l2State(PTEAddress) != HLineState_DIRTY) {
      SYS.MEM.writeByte(PTEAddress, NewPTE(7,0));
    }
  }
  else {
    SYS.MEM.writeByte(PTEAddress, NewPTE(7,0));
```

I claim:

1. A method for simulating, at the register transfer (RTL) level, a cache memory in a computer system having a plurality of functional units which access said cache memory and a main memory system, said method comprising the steps of:

creating for said cache memory an RTL model;

for each of said functional units, creating an RTL model capable of randomly generating (i) an access event to said cache memory at a programmable frequency, and (ii) an address for use with said access event; and at each simulation time period, invoking said RTL model of each of said functional unit to generate said access event probabilistically, and if said access event is generated, simulating access to said cache memory by submitting said address to said RTL model of said cache memory in simulated access of said cache memory.

2. A method as in claim 1, further comprising the steps of:

creating for said memory system an RTL model, said RTL model maintaining a first memory image;

maintaining a second memory image accessible by said functional units, said memory image being initialized to be identical to said first memory image initially and updated whenever said first memory image is updated; and at the end of each of said simulation period, performing the steps of:

retrieving from said RTL model of said cache memory data returned from any read access completed in said simulation period;

and comparing said data with corresponding data in said second memory image.

3. A method as in claim 1, wherein said RTL model of said functional unit generates an access event whenever a randomly generated number exceeds a programmable value.

4. A method as in claim 1, wherein said randomly generated address falls into a predetermined address range.

5. A method as in claim 1, wherein said randomly generated address is an address of a page table entry.

6. A method as in claim 1, wherein said randomly generated address falls within a programmable index range and a programmable tag range.

7. A method as in claim 1, wherein said functional units comprises a functional unit selected from the group: a first level instruction cache, a first level data cache, an instruction table lookaside buffer, and a data table lookaside buffer.

8. A method as in claim 7, wherein said first level data cache is modelled by a first RTL model for simulating a read access by said first level data cache, and a second RTL model for simulating a write access by said first level data cache.

9. A method as in claim 1, wherein said RTL model of each of said functional units comprises a state machine, for simulating operations of said RTL model spanning multiple simulation periods.

10. A method as in claim 1, wherein said cache memory is a secondary cache memory.

11. A method as in claim 1, wherein said cache computer system implements a two-level address translation scheme, and wherein said functional units include a table lookaside buffer for address translation.

* * * * *